US007795988B2

(12) United States Patent
Bue et al.

(10) Patent No.: US 7,795,988 B2
(45) Date of Patent: Sep. 14, 2010

(54) COMPACT AUTOMATIC IMPEDANCE ADAPTER IN A WAVEGUIDE

(75) Inventors: Frederic Bue, Lille (FR); Christophe Gaquiere, Villeneuve d'Ascq (FR); Nicolas Vellas, Lille (FR); Damien Ducatteau, Bondues (FR)

(73) Assignees: Centre National de la Recherche Scientifique, Paris (FR); Univerisite des Sciences et Technologies de Lille-USTL, Villeneuve d'Ascq (FR)

( * ) Notice: Subject to any disclaimer, the term of this patent is extended or adjusted under 35 U.S.C. 154(b) by 204 days.

(21) Appl. No.: 11/916,645

(22) PCT Filed: Jun. 6, 2006

(86) PCT No.: PCT/FR2006/001276

§ 371 (c)(1), (2), (4) Date: May 16, 2008

(87) PCT Pub. No.: WO2006/131638

PCT Pub. Date: Dec. 14, 2006

(65) Prior Publication Data

US 2008/0218286 A1 Sep. 11, 2008

(30) Foreign Application Priority Data

Jun. 6, 2005 (FR) .................................. 05 05707

(51) Int. Cl.
*H03H 7/40* (2006.01)

(52) U.S. Cl. ......................... 333/17.3; 333/33; 333/253

(58) Field of Classification Search ................. 333/209, 333/208, 229, 231, 232, 235, 17.3, 33, 253
See application file for complete search history.

(56) References Cited

U.S. PATENT DOCUMENTS

| | | | |
|---|---|---|---|
| 2,543,721 | A | 2/1951 | Collard et al. |
| 5,039,966 | A | 8/1991 | Schmid et al. |
| 5,939,953 | A | 8/1999 | Yogo et al. |
| 2004/0261717 | A1 | 12/2004 | Ishii et al. |

OTHER PUBLICATIONS

EPO International Search Report re PCT/FR2006/001276, completed Sep. 6, 2006, mailed Sep. 19, 2006.

Mitsubishi Electric Corp., Patent Abstracts of Japan of JP 57 089303 A, "Short-Circuit Plate Device," Sep. 7, 1982, vol. 006, No. 173, Figs 3-5.

B. Bogdanovch, et al., "Design of an E-H Tuner and an Adjustable Directional Coupler for High-Power Waveguide Systems", 8th European Particle Accelerator Conference, Jun. 3, 2002, pp. 506-508.

Nisshin Denki Seisakusho:KK, Patent Abstracts of Japan of JP 07 153599 A, "Automatic Tuning Method and Device for Plasma Generating Microwave Circuit," Oct. 31, 1995, vol. 1995, No. 09.

*Primary Examiner*—Stephen E Jones
(74) *Attorney, Agent, or Firm*—Duane Morris LLP

(57) ABSTRACT

The invention relates to a compact automatic impedance adapter in a waveguide, characterised in that the impedance is controlled by plungers, filling the entire guide with a magic-tee coupler plane E/plane H modifying the electrical and magnetic field, one plunger modifying the electrical field (E) in the guide and the second modifying the magnetic field (H).

18 Claims, 2 Drawing Sheets

COMPACT AUTOMATIC IMPEDANCE ADAPTER IN A WAVEGUIDE

The present invention relates to the field of electronic and communication technologies.

The present invention more particularly relates to an automatic impedance adapter in a waveguide.

The technology in a waveguide is currently used beyond 40 GHz by the two following manufacturers: Maury and Focus-Microwave (Trademarks).

Both manufacturers use a plunger moving along axis Ox and Oy. When the position of the plunger changes along axis Oy inside the slit guide, the latter locally modifies the standing-wave ratio. Then, according to the position (Ox, Oy) of the plungers, the tuner has four different parameters $S_{ij}$. The movement of the plungers along both axes is performed by means of two high precision step-by-step engines driven by a bus GPIB. For the motion along the axis Ox, the whole block (motors+plunger) moves along the waveguide thanks to a guiding axle as is the case for the commercially available coaxial tuners.

The prior art knows from U.S. Pat. No. 5,910,754 (Maury Microwave) a tuner in a waveguide having a reduced height for the adaptation of impedance.

The major advantage of tuners in a waveguide with respect to coaxial tuners is their resistance to power. Such tuners resist powers 5 to 10 times more important than their coaxial equivalence. This is mainly the result of standard connectors used in coaxial tuners which are very small in dimensions so that they have low loss at high frequency. This is the reason why their behavior under power does not exceed a few Watts.

With an identical frequency band, the accesses of tuners in a waveguide have less loss than the coaxial ones. As a consequence, the dead zone on the Smith diagram is narrower in the case of a tuner in a waveguide. In the same band, such tuners are more efficient.

However, such tuners use rotating motors which, as in the commercially available coaxial tuners, create vibrations damaging the quality of the contact between the access of the component and the microwave tips in the case where measures are taken under microwave tips. But the risk exists, as mentioned above, to damage the components and the tips. In general, the access to these tips with the incorporated polarization circuits, are directly in a waveguide which makes it possible to connect the tuners via a small guide length. However, the waveguides are very rigid which makes it possible for the tuner vibrations to propagate until they reach the access of the component. As the tuner block moves along the axis Ox, the inertia motions created impart alternating motions at the level of the component accesses (component damaged).

Such tuners are heavy and bulky, which makes it impossible to position the tuners close to the microwave tips. This results in an increase in loss between the component accesses and the tuner accesses (input-output adaptation). This is the reason why the dead zone on the Smith diagram becomes more important, which thus limits the tuner performances.

As is the case with coaxial tuners, their prices remain prohibitive.

Impedance adaptors in a waveguide having the shape of a magic tee-coupler plane E/plane H are also known from U.S. Pat. No. 5,939,953. Such adapters, like the above-mentioned solutions of the prior art, have an important efficiency loss resulting from the loss of a part of the electromagnetic field in the guides of the plungers. As mentioned in the following, such loss is partly the result of the free space between the plungers and the housing in which they are positioned.

The aim of the present invention is to provide a fully automated tuner plane E/plane H in a waveguide scanning frequencies ranges from a few GHz to 800 GHz. Are commercially available manually-operated plane E/plane H tuners, whose performance are excellent. The idea consists in using such technology while making many modifications, so as to make it automatic and more efficient than the existing manual systems. The aim consists in reducing the time relating to the characterization of components and substantially enhancing the quality of measures and the repeatability of the latter. It should be reminded that the commercially available automatic tuners in a waveguide mentioned here-above are not plane E/plane H tuners.

The present invention aims at remedying the prior art disadvantages by providing a more compact, lighter, impedance adapter more specially dedicated to the measures on wafer (low vibration) and which has no frequency limitations in a frequency band imposed by the guide dimensions.

For this purpose, the present invention, in its broadest sense, relates to an impedance adapter in a waveguide in which the impedance is controlled by plungers filling the entire guide of a magic tee-coupler plane E/plane H modifying the electric and magnetic field, a plunger modifying the electric field (E) in the guide and the second modifying the field magnetic (H).

"Plunger filling the entire guide" means that the plunger having a general section substantially identical with the guide internal cavity, as far as the shape and dimensions are concerned, such that the plunger can slide in the guide without leaving any significant space (which is the case in most solutions of the prior art), filling with air and causing a loss of efficiency of the impedance adapter.

Thus, the invention provides the adaptation of the geometric shape of plungers to the shape d of the waveguide (±100 μm because of the machining tolerances and of the sliding required in the waveguide).

With respect to the solutions of the prior art, the tuner according to the invention is compact, light and offers a repeatability and accuracy on the impedance synthesis.

Advantageously, said impedance adapter shows no motion on the horizontal axis, both plungers plane E/plane H making it possible to adjust the adaptation of the waveguide without requiring any motion of one of them. Then, the presence of rotating motors causing vibration is avoided.

According to one embodiment, said impedance adapter includes two linear jacks connected to plungers via a sliding connection with a return mechanism.

Preferably, an impedance adapter is used for frequencies higher than 1 GHz.

Preferably, the impedance adapter is used for frequencies lower than 800 GHz.

According to various embodiments:

- at least one of said plungers has at least one section portion smaller than the general section of said plunger;
- both plungers have at least one section portion smaller than the general section of said plunger;
- said portion has a width, in the longitudinal direction, equal to a quarter of the wavelengths propagated in the waveguide;
- said portion is substantially positioned at the end of said plunger;
- said plunger/plungers offers/offer a plurality of section portions smaller than the general section of the plungers;
- said plunger/plungers offers/offers two section portions smaller than the general section of the plungers.

Such various configurations make it possible to reduce the loss of charge in the plunger-resonator guides.

Another object of the invention is a method for manufacturing an impedance adapter in the shape of a magic tee-coupler plane E/plane H for a waveguide propagating a wave comprising a step of selection and insertion into the guides of said magic tee-coupler of plungers having, each, at least one longitudinal section portion smaller than the general section of said plungers and adapted in its longitudinal width to the quarter of the wavelength propagated in said waveguide.

The main advantages of the present invention are:

The originality of this tuner resides in the fact that the impedance is controlled by plungers filling the entire guide of a magic tee-coupler plane E/plane H modifying the electric and magnetic field. Thus, the microwave performances are much better (−0.3 dB of insertion loss at 60 GHz for our system compared to −3.7 dB for the existing systems, at an impedance of 50 Ohms) and no frequency limitation in the frequency band defined by the dimensions of the guide is established. For a plane E/plane H 75-110 GHz tuner, only the 75-95 GHz bandwidth is covered with the present systems).

This tuner shows no motion on the horizontal axis (no problem of gravity center and shearing torque on the elements outside the tuner). This is an important point during microwaves measurement on the wafer.

This system is much more compact than the existing systems, since all the tuners in a waveguide which are automatically operated show a motion on the horizontal axis which entails a more important overall dimensions (ratio 3.7 to volume). This is an important point during the microwave measurements on wafer.

This system is much lighter than the existing automatic systems (ratio, at least 3 to the weight). This is an important point during the microwave measurements on wafer.

The microwave performances are much better (−0.3 dB of insertion loss at 60 GHz for our system compared to −3.7 dB for the existing systems, at an impedance of 50 Ohms).

Under these conditions, the manufacturing cost is much lower.

No vibration problem thanks to the nature of the motors used. This is an important point during the microwave measurements on wafer.

The resolution on the impedances obtained is much better (motion of the plungers of the order of 0.5 μm) thanks to the design (slug motor connection) and to the motorizations used.

The repeatability on the impedances made is excellent thanks to the design (plunger motor connection) and to the motorizations used.

The invention will be better understood using the description given hereinafter only for explanations of an embodiment of the invention, while referring to the appended figures, among which:

Figure 1:
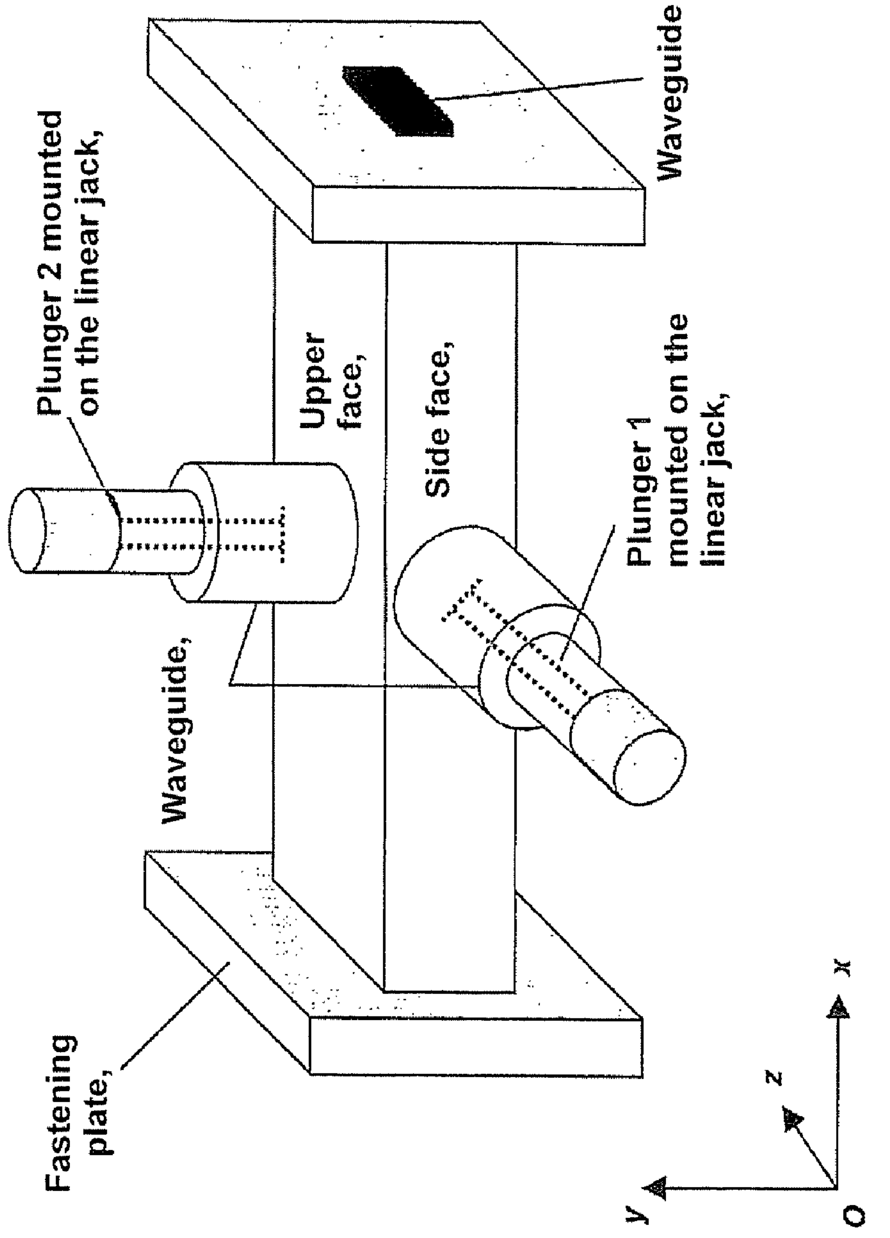
FIG. 1 illustrates the tuner according to the present invention.

While referring to FIG. 1, the type of tuner thus made has no translation motion along axis Ox. It has two plungers the translation motion of which is performed, for the one along axis Oy and for the other one along axis Oz. These two plungers are enclosed in a piece of waveguide ("protrusions" located on the side and upper faces of the waveguide). Their translation motion along their respective axis varies the effective length of the guide pieces. A plunger modifies the electric field (E) in the guide, whereas the second one modifies the magnetic field (H) which gave their name of plane E/plane H. Consequently, the motion of plungers makes it possible to vary the impedance at the guide inlet and outlet.

However, the insertion losses of the tuners change with the position of plungers. Then, it is difficult to determine during the characterization of power transistors without an automatic tuner whether the tuner losses diminish or whether the power supplied by the charged transistor increase when the position of the plungers is adjusted.

Figure 2:
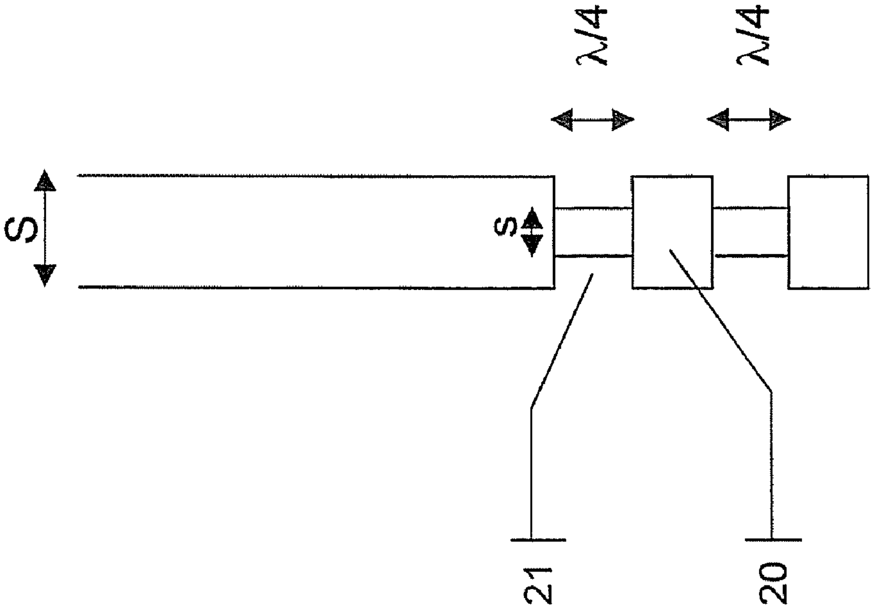
FIG. 2 illustrates a plunger-resonator for the invention.

While referring to FIG. 2, a modified plunger called a "resonator" having a rectangular section and a succession of short-circuits 20 and open circuits 21. The open circuits 21 are portions, in the longitudinal direction, of the resonator having a regular section S (having same shape as the general section of the plunger) and smaller than the general section S of the plunger-resonator. FIG. 2 shows a resonator having two open circuits 21, the resonator ending with a short-circuit (having a section equal to S), filling the entire width of the guide of the magic tee-coupler. However, the last open circuit in the longitudinal direction of the resonator is positioned substantially at the end of the latter for instance, less than a quarter wavelength.

Such open circuits have a width, in the longitudinal direction of the resonator, which is equal to a quarter wavelength and the adaptation of which is desired.

Even though experiments showed the efficiency of a configuration of the resonator having two open circuits, it is considered to provide resonators having only one open circuit (simpler manufacturing) or more than two open circuits, for instance 3.

According to the desired use and the wave frequencies to be adapted, various resonators can be changed in order to use only those adapted to the quarter wavelength considered.

Eventually, a multi-wave resonator is also considered, having several open circuits adapted to several wavelengths: a first circuit has a width of 6 mm (adapted to 50 GHz), a second circuit has a width of 3 mm (adapted to 100 GHz).

Figure 3:
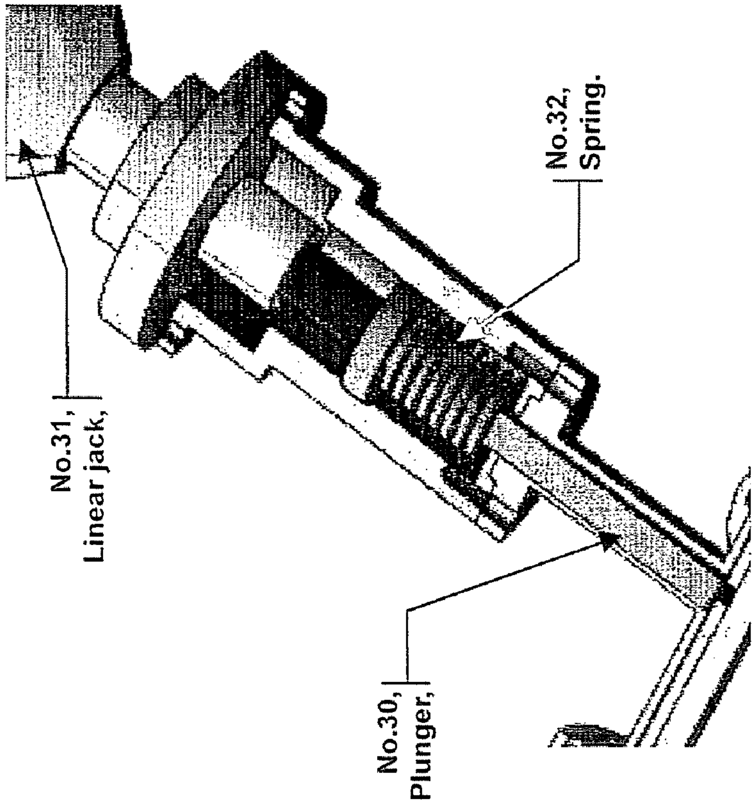
FIG. 3 shows an exemplary structure for driving a plunger of FIGS. 1 and 2.

While referring to FIG. 3, the driving of the plungers 30 implemented in the invention is carried out through a linear translation system 31, of the motorized jack type. In order to be able to cause the translation of a plunger 30 in the arms of the magic tee-coupler, a decoupling between the plunger and the motorization system 31 is made via a compression spring 32. The latter makes it possible to return the plunger to the upper position when the jack is also placed in the upper position.

The linear jack 31 can be of the NSA12 jack type supplied by the Micro-Control Company (trade name). This jack makes it possible to have a travel of 10 mm with an accuracy of 0.1 μm. The repeatability of the assembly is estimated at 2 μm, but it is substantially the result of the machining and mounting tolerances.

The dimensions of the compression spring 32 were chosen so that it does not exert a stress greater than the axial stress which is allowable for the linear jack (that is 18 N for jack NSA12). But, it must also secure a motion of at least the order of the micron. To fulfill this type of obligation, it is necessary to apply a preload on spring $\Delta x$, a preload which makes it possible to compensate the stress resulting from the weight of the plunger. Thus, a spring having a free length of 33 mm, a minimum length of 8.7 mm (which thus allows a travel of about 20 mm of the plunger) and a rigidity of 56 $mN \cdot mm^{-1}$ was chosen.

The invention is described hereabove as an example. It is well understood that the specialists in the art will bring various modifications to the invention without leaving the scope of the patent.

The invention claimed is:

1. An impedance adapter in a waveguide comprising:

an impedance adapter that includes multiple plungers and a magic tee-coupler of plane E/plane H, wherein the multiple plungers control an impedance of the impedance adapter, wherein each plunger is designed to fill the entire guide of the magic tee-coupler of plane E/plane H, thereby modifying the electric and magnetic field, each plunger having a section substantially identical with the guide internal cavity such that the plunger slides in the guide without leaving any significant space filling with air, wherein the multiple plungers including a first plunger that modifies the electric field (E) in the guide and a second plunger that modifies the field magnetic (H).

2. The impedance adapter as defined in claim 1, wherein the impedance adapter shows no motion on the horizontal axis.

3. The impedance adapter as defined in claim 1, wherein the impedance adapter is used for frequencies higher than 1 GHz.

4. The impedance adapter as defined in claim 1, wherein the impedance adapter is used for frequencies lower than 800 GHz.

5. The impedance adapter as defined in claim 1, wherein each plunger is driven by a linear jack.

6. The impedance adapter as defined in claim 5, wherein said jacks are connected to the plungers through a sliding joint.

7. The impedance adapter as defined in claim 5, wherein said linear jacks are connected to return mechanisms.

8. A waveguide comprising:

a magic-tee coupler of plane E/plane H coupled to the waveguide for propagating a wave; and first and second plungers, each plunger having a section substantially identical with an internal cavity of a guide of the magic-tee coupler such that the plunger slides in the guide without leaving any significant space filling with air, wherein as the plungers fill the magic-tee coupler, the plungers modify the electric field (E) or the field magnetic, or both.

9. The waveguide as defined in claim 8, wherein the waveguide is used for frequencies higher than 1 GHz.

10. The waveguide as defined in claim 8, wherein the waveguide is used for frequencies lower than 800 GHz.

11. The waveguide as defined in claim 8, wherein the waveguide shows no motion on the horizontal axis.

12. The waveguide as defined in claim 8, wherein each plunger is driven by a linear jack.

13. The waveguide as defined in claim 12, wherein said jacks are connected to the plungers through a sliding joint.

14. The waveguide as defined in claim 12, wherein said linear jacks are connected to return mechanisms.

15. A method for manufacturing a waveguide comprising the steps of:

coupling an impedance adapter to the waveguide that forms a magic-tee coupler of plane E/plane H for propagating a wave;

providing plungers each having a section substantially identical with the guide internal cavity such that the plungers slide in the guides of the magic-tee coupler without leaving any significant space filling with air;

inserting the plungers in the guides of said magic-tee coupler.

16. The method as defined in claim 15, further comprising driving each plunger by a linear jack.

17. The method as defined in claim 16, further comprising connecting said jacks to the plungers through a sliding joint.

18. The method as defined in claim 16, further comprising connecting said linear jacks to return mechanisms.

* * * * *

UNITED STATES PATENT AND TRADEMARK OFFICE

CERTIFICATE OF CORRECTION

PATENT NO. : 7,795,988 B2
APPLICATION NO. : 11/916645
DATED : September 14, 2010
INVENTOR(S) : Frederic Bue et al.

It is certified that error appears in the above-identified patent and that said Letters Patent is hereby corrected as shown below:

Cover Page, Item 73, correct spelling of Assignee: should read as follows:
Centre National de la Recherche Scientifique - CNRS Signed and Sealed this
Twenty-second Day of February, 2011

David J. Kappos
*Director of the United States Patent and Trademark Office*